United States Patent [19]
Wetherbee

[11] 4,068,290
[45] Jan. 10, 1978

[54] CANTILEVER CIRCUIT CARD GUIDE

[75] Inventor: Daryl Clifford Wetherbee, Roseville, Minn.

[73] Assignee: Control Data Corporation, Minneapolis, Minn.

[21] Appl. No.: 784,104

[22] Filed: Apr. 4, 1977

[51] Int. Cl.² .............................................. H02B 1/02
[52] U.S. Cl. .................................................. 361/415
[58] Field of Search ................. 361/415, 399; 339/65; 211/41

[56] References Cited

U.S. PATENT DOCUMENTS

| 2,993,187 | 7/1961 | Bisbing | 211/41 |
| 3,733,523 | 5/1973 | Reynolds et al. | 361/415 |
| 3,895,719 | 7/1975 | Cakora | 361/415 |

Primary Examiner—David Smith, Jr.
Attorney, Agent, or Firm—Edward L. Schwarz

[57] ABSTRACT

A circuit card guide adapted to be fastened in a temporary fashion between permanently attached card guides so as to permit the guiding and retaining of circuit cards having a width substantially less than the spacing between the permanent guides.

5 Claims, 3 Drawing Figures

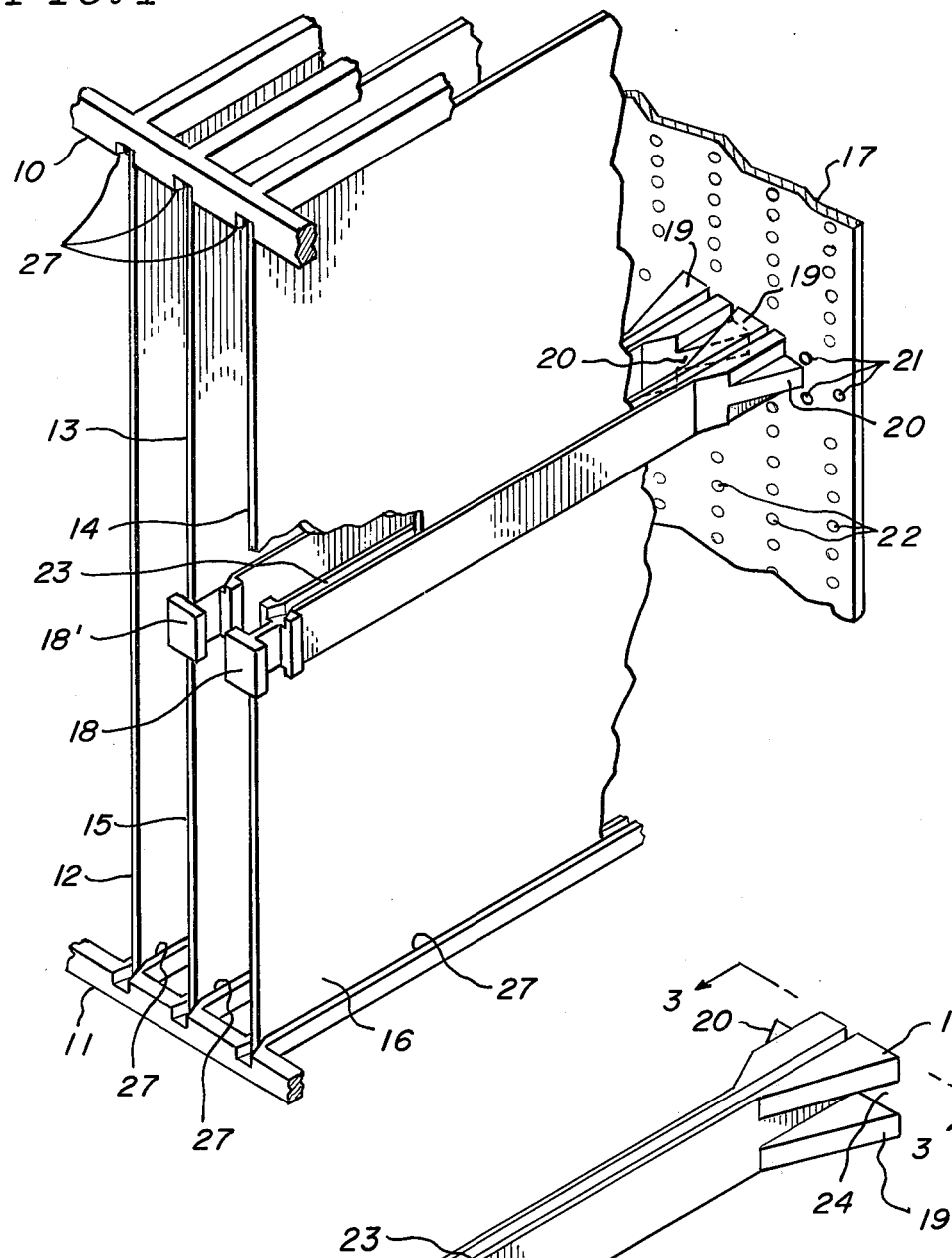
FIG. 1
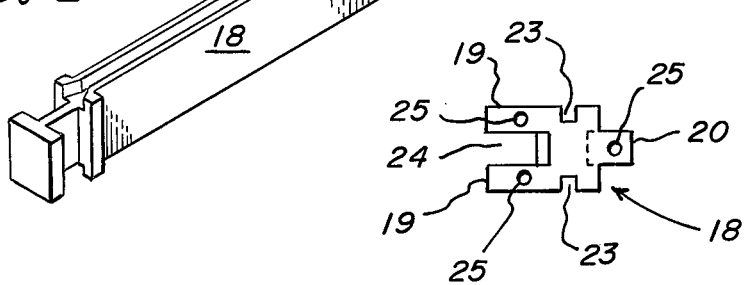
FIG. 2
FIG. 3

CANTILEVER CIRCUIT CARD GUIDE

BACKGROUND OF THE INVENTION

1. Field of the Invention

For various reasons, both economic and technical, individual circuit card modules are frequently of quite large size, exceeding 20 cm. in length and width. With the increasing density of logic functions per component, even one circuit board can perform a large number of complicated functions. This being the case, it frequently arises that optional functions available for various devices cannot be conveniently placed on one or more standard size cards, in that only a fraction of the area of one or more cards may be filled. This of course is wasteful of circuit card and backpanel space.

Accordingly, it is desirable that half-size or other fractional size cards be usable in such devices. This requires a free-standing card guide which may be placed between the standard guides in specified locations to permit the use of under-width cards. Because of the inability to foresee various changes in operation of the device that may be belatedly added in the field, it is desirable that these intermediate guides be easily attached and detached.

Such intermediate card guides should have a substantial percentage of the mechanical strength and rigidity of permanent guides and yet, if necessary, be locatable in adjacent card positions, to provide maximum flexibility in selection of these positions for cards with particular functions. Because of the relatively close spacing between adjacent card positions, little area is available for bracing the bases of the intermediate guides.

2. Description of the Prior Art

Although no specific art is known which addresses this problem, there are a variety of obvious techniques which immediately come to mind. One might be a guide having opposite facing slots with feet projecting at right angles thereto and made rigid with fastening screws passing through holes therein and bolting to the connector panel. A variation might find these feet interlocking in above and below fashion so as to allow adjacent feet on adjacent guides to be fastened by a single screw. Such an approach does not allow a single guide adjacent another to be easily attached or detached. Holes may be provided in the back panel which receive the end of the guide and are retained therein with a snap-locking arrangement or with the screws inserted on the wiring side of a back panel. Alternatively, a bracing framework designed to fit in the spaces between adjacent cards can provide the stability needed for a guide having an insufficiently rigid attachment to a back panel. It would be possible to make a very rigid intermediate card guide by ganging several together and bolting them to the back panel as a unit. However, this latter approach decreases flexibility in choice of location for individual small-width cards.

BRIEF DESCRIPTION OF THE INVENTION

To avoid the disadvantages of these alternative embodiments, a stand-alone or cantilever card guide according to this invention has a tongue on the base end of the guide projecting transverse to the direction faced by its slot or slots. A pair of projections similar to and facing opposite the tongue on the base end defines between them a groove facing of the proper width and position to permit the tongue on an identical circuit guide to project into the groove. The surfaces of the tongue and the projections adjacent the base end of the guide should be located so to contact the connector block when the guide is attached to it, thereby lending lateral stability to the guide. Attachment can be with self-tapping screws which fit through holes in the connector block and tap into holes in the two projections and the tongue. Preferably, the tongue fits snugly, but without an interference fit, into the groove.

Accordingly, one purpose of this invention is to permit the use of fractional width cards randomly intermixed with full-size cards.

A second purpose is to provide a rigid and strong supporting card guide for such fractional size cards.

Another purpose is to allow fractional size cards to be placed face-to-face with the same spacing used for full-size cards.

Still another purpose is to permit a circuit card panel to be easily modified to accept either fractional size or full-size cards at any desired location.

BRIEF DESCRIPTION OF THE DRAWINGS

FIG. 1 is a perspective view of a portion of a card panel accepting both full-size and fractional cards, and employing the cantilever guide forming the subject of this application.

FIG. 2 is a perspective view of the cantilever card guide shown in FIG. 1, rotated by 180° around the long axis, so as to display the side not shown.

FIG. 3 is an end view of the bottom of the cantilever card guide shown in FIG. 2.

DESCRIPTION OF THE PREFERRED EMBODIMENTS

Referring first to FIG. 1, a portion of a typical circuit card rack is shown as a back panel or connector block array 17 carrying permanent card guides 10 and 11. Guides 10 and 11 are arranged so as to permit full-size card 12, and other cards of identical width, to slip into opposite facing grooves 27 and travel along a preselected path until connectors, not shown, adjacent one end of card 12 mate with connectors 22 in individual connector blocks of panel 17. Location of connectors 22 must create the gaps shown to permit attachment of guides 18, 18', etc. Prior art racks contain only cards having the dimension of card 12, including cards having such dimensions in the positions now occupied by cards 13–16.

According to this invention, fractional width cards 13–16 can be accommodated by such a rack by attaching stand-alone cantilever card guides 18 and 18'. Each guide 18 has oppositely facing grooves 23 (see FIG. 2) adapted to receive an edge of fractional width cards 13–16. Guide 18 is attached to back panel 17 by screws (not shown) which pass through holes similar to holes 21 shown and tap into holes 25 (FIG. 3) at the base end of guide 18. Lateral stability for guide 18 is afforded by projections 19 and tongue 20 which serve to significantly increase the base lateral dimension. Projections 19 define between them groove 24 which has a width and depth slightly greater than the corresponding width and length of tongue 20. Thus, guides 18 and 18' can be placed so as to accommodate cards 15 and 16 at their normal spacing from one another, with substantial lateral rigidity. The fact that groove 24 has parallel sides and bottom permits removal of any guide 18 without disturbing adjacent guides 18'. If only a single fractional width card 13–16 is inserted in guide 18, some problem of deflections of guide 18 responsive to bending moments having a vector perpendicular to the cards may occur. When only a single fractional width card is employed, a blank card may be inserted between the other slot in such guide 18 and the specific slot 27 in permanent guide 10 or 11. Such a blank card will assist the component-carrying card in resisting such bending moments.

It is apparent that additional flexibility in layout and design of circuit card racks is possible by employing card guides 18 between permanent guides 10 and 11 so as to allow the card rack to accept fractional width cards. By proper design of back panel 17, fractional widths other than approximately one-half that of full size card 12 can be accommodated.

The preceding describes the invention.

What is claimed is:

1. An improved cantilevered circuit card guide of the type to be attached at its base to a connector block, and having a pair of oppositely facing parallel slots each adapted to receive an edge of a circuit card and permit it to slide therein toward the connector block, wherein the improvement comprises a) a tongue on the base end projecting approximately transverse to the directions faced by the slots and contacting the connector block when attached thereto, and b) a pair of projections on the base end, defining between them a groove oppositely facing from the tongue, and contacting the connector block when attached thereto, and allowing the tongue on an identical circuit card guide attached adjacent the groove with its tongue facing it, to project into the groove.

2. The article of claim 1, wherein the groove is substantially parallel to the slots.

3. The article of claim 2, wherein the bottom of the groove is substantially parallel to the sides of the slots.

4. The article of claim 1 wherein the width of the tongue is slightly less than the width of the groove.

5. The card guide of claim 1, further comprising
   a. a circuit card connector panel having a plurality of connector blocks aligned side by side, and having spaced groups of connectors, the space between groups being wider than the base of the card guide measured along the direction faced by a slot, and at least one hole between the groups; and
   b. mounting means passing through the hole in the space between groups of connectors for detachably mounting the card guide by its base in said space.

* * * * *